(12) United States Patent
Hampel

(10) Patent No.: US 7,869,707 B2
(45) Date of Patent: Jan. 11, 2011

(54) MEASURING SYSTEM COMPRISING AN INTELLIGENT SENSOR HEAD AND HAVING A REDUCED POWER CONSUMPTION FOR MEDIUM-VOLTAGE OR HIGH-VOLTAGE SYSTEMS OR IN MINING, AND METHOD THEREFOR

(75) Inventor: Hermann Hampel, Grosshabersdorf (DE)

(73) Assignee: IAD Gesellschaft fuer Informatik, Automatisierung und Datenverarbeitung mbH, Grosshabersdorf (DE)

( * ) Notice: Subject to any disclaimer, the term of this patent is extended or adjusted under 35 U.S.C. 154(b) by 1252 days.

(21) Appl. No.: 10/547,181

(22) PCT Filed: Feb. 12, 2004

(86) PCT No.: PCT/EP2004/001315

§ 371 (c)(1),
(2), (4) Date: Aug. 29, 2005

(87) PCT Pub. No.: WO2004/072662

PCT Pub. Date: Aug. 26, 2004

(65) Prior Publication Data

US 2006/0291856 A1    Dec. 28, 2006

(30) Foreign Application Priority Data

Feb. 12, 2003    (DE) .................................. 103 05 986

(51) Int. Cl.
H04B 10/08    (2006.01)
(52) U.S. Cl. ................................ 398/9; 398/25; 398/38; 398/33; 398/15
(58) Field of Classification Search ...................... 398/9, 398/135, 115, 38, 33, 25, 15, 16
See application file for complete search history.

(56) References Cited

U.S. PATENT DOCUMENTS 4,290,146 A * 9/1981 Adolfsson et al. ............. 398/38

(Continued)

FOREIGN PATENT DOCUMENTS

DE    37 27 950    3/1988

(Continued)

Primary Examiner—Ken N Vanderpuye
Assistant Examiner—Hibret A Woldekidan
(74) Attorney, Agent, or Firm—Paul Vincent

(57) ABSTRACT

Differently designed measuring systems exist of which most contain a central signal processing unit and a number of electrical measuring components, and in which the measured values furnished by the measuring components are optically transmitted over optical wave guides. The aim of the invention is to provide a measuring system of this type, which has low power consumption and enables a reliable optical data transmission. To this end, an optical loop is provided between a central measuring unit (MG) and a sensor head (SK). Microprocessors (MP1, MP2), which are situated inside the central measuring unit (MG) and inside the sensor head (SK), carry out transmitting, measuring and monitoring tasks as a distributed controller with bi-directional data communication. A frame synchronization signal serves both for supplying power as well as for deriving a clock signal for block-oriented data transmission. A data communication is carried out for conducting a parameterization and/or programming between the central measuring unit (MG) and the sensor head (SK), and a pre-preprocessing of the measured values is carried out in the sensor head (SK), particularly a measured value correction and/or a range switching and/or a reprogramming of the filtering characteristics and/or an automatic compensation are/is carried out in the sensor head (SK).

2 Claims, 11 Drawing Sheets

U.S. PATENT DOCUMENTS

| | | | | |
|---|---|---|---|---|
| 4,731,879 A | * | 3/1988 | Sepp et al. | 398/170 |
| 4,757,263 A | | 7/1988 | Cummings | |
| 4,810,957 A | * | 3/1989 | Rubbmark et al. | 324/663 |
| 4,891,772 A | * | 1/1990 | Case et al. | 702/159 |
| 5,112,134 A | * | 5/1992 | Chow et al. | 356/427 |
| 5,257,210 A | * | 10/1993 | Schneider et al. | 702/109 |
| 5,453,866 A | * | 9/1995 | Gross | 398/110 |
| 5,528,409 A | * | 6/1996 | Cucci et al. | 398/15 |
| 5,764,706 A | * | 6/1998 | Carlin et al. | 375/326 |
| 5,771,114 A | | 6/1998 | Andersson | |
| 5,796,890 A | * | 8/1998 | Tsuji et al. | 385/24 |
| 6,211,982 B1 | * | 4/2001 | Goldner et al. | 398/168 |
| 6,483,617 B1 | * | 11/2002 | Roberts | 398/29 |
| 2004/0096222 A1 | * | 5/2004 | Cagenius | 398/115 |
| 2007/0140690 A1 | * | 6/2007 | Aronson et al. | 398/33 |

FOREIGN PATENT DOCUMENTS

| | | |
|---|---|---|
| DE | 38 24 000 | 5/1989 |
| DE | 195 43 363 | 5/1997 |
| DE | 198 32 707 | 1/2000 |
| DE | 100 10 913 | 8/2001 |

* cited by examiner

MEASURING SYSTEM COMPRISING AN INTELLIGENT SENSOR HEAD AND HAVING A REDUCED POWER CONSUMPTION FOR MEDIUM-VOLTAGE OR HIGH-VOLTAGE SYSTEMS OR IN MINING, AND METHOD THEREFOR

This application is the national stage of PCT/EP2004/001315 filed on Feb. 12, 2004 and claims Paris Convention priority of DE 103 05 986.5 filed Feb. 12, 2003

BACKGROUND OF THE INVENTION

The invention primarily concerns a measuring system with optical signal and energy transmission between an intelligent sensor head and a central measuring unit for medium-voltage or high-voltage systems or in mining. Furthermore, the invention relates to method therfor.

For measuring the operating voltage in medium- or high-voltage station control systems normally voltage transformers are used. According to the operating voltage of the station control system the isolation and turns ratio have to be chosen in order to decrease the operating voltage to an indicating voltage of less than 100 V which is suitable for measurement purposes. Depending on the respective task (billing measurement, line and apparatus protection technique, performance measurement technique) single-pole or two-pole isolated voltage transformers are used in very different forms of construction.

Voltage transformers generally make up a high share of costs for station control systems and station control instrumentations. They have large physical dimensions and have influence on the construction of the station control system. They are sensitive against excessive voltages and represent the weakest element of hardware in the construction of a station control system. Secondary connection lines between voltage transformer and protective relay or between voltage transformer and measurement unit can be considerably influenced by magnetic fields, ground leakage currents, short-circuit currents and interference fields, which often leads to a distortion of the measurement results.

DE 37 27 950 C2 discloses a device for performing voltage measurements in medium-voltage and high-voltage station control systems, which offers a complete substitution for usage of voltage transformers within the scope of performance measurement technique. The opto-electronic sensors used there enable an electrical and mechanical decoupling of measurement location and indication, they are insensitive to interference fields and excessive voltages and are also distinguished by small physical dimensions and relatively low costs. For performing voltage measurements as a phase comparison measurement, in particular two opto-elektronic sensors are provided which are connected at the supporting insulator with switching electrode. Furthermore, two opto-electronic sensors of ferroelectric type are provided which are each connected over optical wave guide with a remote situated transceiver unit and which are sampled simultaneously by these transceiver units by means of the reflection method. A phase comparison device is connected to both transceiver units whereas two comparators connected to both transceiver units convert the conveyed analog input signal into a square-wave signal. Two monostable multivibrators connected to the comparators generate short pulses from the square-wave signal synchronous to the zero crossovers of both phases. Finally, a sum counter is provided which is connected to the output of both multivibrators and counts simultaneously incoming pulses as a single pulse and counts incoming pulses with a delay as separate pulses. Devices for evaluation and indication of phase coincidence, phase opposition, lack of a phase distribution and functionality are connected to the outputs of the sum counter. In an alternative way of realization a series connection of a diode and a further capacitor is provided parallel to the capacitor between switching electrode and earth and a voltage dependent CMOS pulse generator is connected parallel to this. The outputs of the pulse generator are connected over a capacitor to the opto-electronic sensor of ferroelectric type, which is connected via optical wave-guide with a light transceiver with measuring amplifier. The measuring amplifier contains an element for converting the pulse frequency into a value appropriate for the input of a voltage measurement device, consisting of a digital-to-analogue converter or a frequency-to-voltage converter. In a device according to DE 37 27 950 C2 signal processing and evaluation is done remote from the measurement location, respectively centrally.

DE 38 24 000 C2 discloses a monitoring unit for protection against damage to pylons where sensors other than optical wave-guide sensors can also be used. In particular, at every foot of the pylon an optical wave guide, an infrared detector or a vibration detector is employed as a sensor and from there an optical wave guide is conducted to the monitoring device. In case of the optical wave-guide sensor a dismantled wave guide of loop type is conducted along a corner support foot of the pylon and, at the upper end of the monitoring area, passes into a twin-wire mantled optical wave-guide cable. This cable is conducted along a corner support of the pylon to a central monitoring device which is located in a metal housing within the upper third of the pylon on a cross beam of the pylon. Besides the central monitoring device, for every infrared detector and vibration detector a single monitoring device exists which is made up of an electronic module in a metal housing and is located at the upper end of the monitoring area in a corner support of the pylon. From there a single-wire optical wave-guide cable is conducted to the central monitoring device. While infrared or vibration detectors are integrated into the signal device, in the case of the optical wave-guide sensor its conductor only is inserted into the signal device. In the central device the optical signals transmitted from the single devices are converted and provided to the evaluation logic which, in co-operation with the task scheduler, forwards the alarm message via radio data transmission to an observation point. There a distinction of the signal devices, which triggered the message, is possible. The signal devices with infrared detector or vibration detector have a battery supply and the following components, which are in series arrangement: sensor, amplifier, filter, evaluation logic, light emitting diode and socket for the connector of the optical wave guide cable to the central device. Furthermore, a HP filter for suppressing unwanted temperature outputs is used for the passive infrared detector, whereas an active BP filter for frequency selection is used for the vibration detector. In the evaluation logic a decision is made whether there is an alarm case or not. In the monitoring device according to DE 38 24 000 C2 a signal pre-processing and evaluation is already performed at the measuring location.

DE 198 32 707 C2 discloses a combined current and voltage converter for outdoor switching stations with a semi-conventional voltage converter of a CC-, RR- or RC-divider type and an all-optical current converter in form of an optical wave guide loop surrounding the high-voltage conductor. Furthermore, a common converter evaluation device for both current converter and voltage converter is provided which has ground potential. When evaluating the signals from the voltage converter and the current converter, the measurement values of the single phases can thus be assigned to each other, and a phase-synchronous measurement of the single phases can be performed.

DE 195 43 363 C2 discloses a transducer arrangement for measuring currents and voltages in medium- or high-voltage systems comprising at least one current or voltage sensor for acquisition of measurement values, one coder for encoding of measurement values, one optical transmitter for transmitting and one optical receiver for receiving of the encoded measurement values, and at least one decoder for decoding of measurement values at the receiver location. For enabling an easy installation of the transducer arrangement in a medium- or high-voltage system as well as an adaptation to the respective measurement requirements without big efforts, the transducer arrangement consists of combinable modules with standardized interfaces. Moreover, at least one sensor module is provided with the current or voltage sensor, at least one transmitter module with the encoder and the voltage sensor, and at least one receiver module with the optical receiver and the decoder. The sensor module and the transmitter module are adapted to each other with respect to their physical dimensions and their connectors and they are combined mechanically to a high-voltage module, which guarantees an easy installation in the high-voltage system. In a preferred embodiment the sensor module for measuring DC or AC voltages comprises a voltage sensor in the form of a preferably frequency compensated ohmic voltage divider which is provided with a surge protector on the low voltage side. The transmitter module may comprise a voltage-to-frequency converter for generating a pulsed carrier signal as an encoder as well as an optical transmitter with at least a transmitter diode for converting the carrier signal into optical pulses. The receiver module accordingly comprises an optical receiver with a light sensitive receiver diode for converting optical pulses into an electrical pulsed carrier signal as well as a frequency-to-voltage converter as a decoder. Transmitter module and receiver module are both connected together with an optical wave-guide. Furthermore, the high-voltage module comprises an auxiliary energy supply unit for supplying the transmitter module whereas the auxiliary energy supply unit is supplied by the optical wave-guide.

DE 100 10 913 C1 discloses a device for monitoring the gas density of an insulating gas-filled high-voltage transmission line, which is separated into several line sections by partition walls, which comprises components placed in the vicinity of the partition walls for measuring the gas density in the line sections and transmitting of measurement results as well as a signal processing unit for receiving and evaluating the measurement results. In particular, the measurement components are supplied by a centrally located energy source containing a light source over at least one energy supply line in form of an optical wave-guide. The measurement components contains opto-electric energy converter for converting light into electric energy and several measurement components are connected in series with the light source over a common energy supply line. The energy supply line and the signal transmission line can also be combined in form of a simple optical wave-guide. The measurement component mainly consists of an energy conditioning unit, a computing unit and a sensor unit. The energy-conditioning unit is supplied with energy by an energy source containing a light source over an energy supply line in form of an optical wave-guide and an opto-electric energy converter. Depending on the configuration of the monitoring device the light source contains one or more laser diode modules each with a power of up to 500 mW. Furthermore the energy conditioning unit contains a capacitor, for example a low leakage current ELKO or an array of tantalum or ceramic capacitors, which stores the energy delivered from the energy source and if required provides it to the computing unit. The computing unit mainly comprises a microprocessor, which serves for controlling the sensor unit, acquisition and preprocessing of the values measured by the sensor unit and transmitting of the preprocessed measured values to the signal processing unit over a light emitting diode, a signal transmission line in form of an optical wave guide and an optical sensor. In the respective method for monitoring the gas density of an isolating gas-filled high-voltage transmission line, the measuring component is fed from the energy source with constant power during a wait cycle, then the gas density is measured by the measuring component, the measured value is transmitted to the signal processing unit and then the measurement component is reset to a wait state up to the next measurement.

Finally, DE 695 20 371 T2 discloses an optical-fiber interface system, wherein a regulation effects that the current fed to a laser light source is as low as admissible so that at the same time a remote interface and a process variable transmitter are provided with sufficient energy. In particular a first locally stationed microcontroller device is provided, which serves for adjustable supply of optical energy at a first output connector and serves for reception of digital encoded, optically transmitted information from the remote location at a first input connector of the microcontroller device. An analog transmit device is electrically connected to the first locally stationed microcontroller device and arranged in a way that optionally either analog or digital information or both at the same time can be conveyed to a local control system. A second microcontroller device is stationed in a remote location, i.e. remote from the first microcontroller device, and serves for receiving of analog and/or digital signals, which define the state of a process variable, like pressure, temperature, flow, motion, density or other parameters, which were captured by a remote process variable transmitter, and for conveying optical coded state information to a second output connector. An energy supply unit is coupled to the second microcontroller unit and the remote process variable transmitter and supplies them with electric energy. The energy supply unit contains an optical-to-electric energy converter with a second input connector. At least one optical fiber is connected between the first output connector of the locally stationed equipment and the second input connector of the remote stationed optical-to-electrical energy converter. The same or a second optical fiber is connected between the second output connector of the remote stationed microcontroller unit and the first input connector of the first locally stationed microcontroller unit. Furthermore, a unit that includes the first microcontroller unit initially conveys optical energy with an eye-safe lower value to the first output connector. The second microcontroller unit reacts to the reception of the eye-safe lower light energy value over the first optical fiber and transmits a start-up command over the fiber-optical link to the first locally stationed microcontroller device, whereby additional light energy above the eye-safe lower value is only delivered to the first optical fiber if it is properly connected between the respective output and input connectors. Furthermore, a light source energy supply unit exists locally which supplies a light source, like e.g. a gas laser, a laser diode or a LED with electrical energy, and the light source contains a device for modulating the intensity of the optical energy, which is conveyed to the first output connector. The first microcontroller unit also contains a first microprocessor for controlling the light source energy supply unit and the light source modulation unit. The first microprocessor receives energy status information from the remote stationed second microcontroller device, which enables a control, particularly a PI control (Proportional-Integral-control), of optical energy, i.e. the laser current which is provided from the local location to the remote location, in a "quasi-static operation" with a check of the laser voltage at regular intervals (status messages: message of six 8-bit bytes).

The above discussion of prior art acknowledges different measurement systems, which mostly contain a central signal processing unit and several electrical measuring components and which perform an optical transmission over optical wave guides of the measured values delivered from the measuring components. As such measuring have to meet high requirements with respect to operational safety, e.g. in monitoring of a high-voltage power switch, a safe capturing of measured values and a reliable fiber-optical data transmission is desirable. However, too little attention is paid to the fact that the constant activation of the laser diode for remote supply of the measuring component leads to a considerable shortening of the lifetime of the laser diode. Additionally, due to electromagnetic influences originating from the high-voltage system, particularly because of switching procedures at a high voltage level, interference signals in the optical signal transmission may cause malfunctions by clock displacement of the measured signals (measured currents respectively measured voltages). Even the fiber-optical interface system according to DE 695 20 371 T2 with its "quasi-static operation" only causes the current fed into the laser light source to be as low as admissible. Therefore, a fiber-optical measuring system is missing in practice, which has low power consumption and enables a safe optical data transmission. This is especially important because the industry manufacturing medium-voltage or high-voltage systems can be considered as a very progressive industry which quickly picks up improvements and simplifications and puts them into practice.

In contrast to known measuring systems, it is the underlying purpose of the present invention to provide such a measuring system that has low energy consumption and yet enables a safe optical data transmission.

SUMMARY OF THE INVENTION

This purpose is achieved in accordance with the patent claims by a measuring system for medium for medium-voltage or high-voltage systems or in mining with optical signal and energy transmission between a sensor head with at least one sensor element and a central measuring unit having an optical transmitter provided in the central measuring unit, which is controlled by a microprocessor to emit a superposition of different light components to a first optical wave guide for purposes of data communication and energy supply of the sensor head, an optical receiver connected to the first optical wave guide and a microprocessor provided in the sensor head, where the microprocessor, being activated by the optical receiver, serves for controlling the sensor element, acquiring and processing of the values measured by the sensor element and controls data communication for transmission of preprocessed measurement values to the central measuring unit over an optical transmitter, a second optical wave guide and an optical receiver located in the central measuring unit wherein said microprocessors carry out transmitting, measuring and monitoring tasks as a distributed controller with bi-directional data communication, wherein a frame synchronization signal serves both for supplying power as well as for deriving a clock signal for block-oriented data transmission and/or a data communication is carried out for conducting a parameterization and/or programming between the central measuring unit and the sensor head, and wherein a preprocessing of the measured values is carried out in the sensor head, particularly a measured value correction and/or a range switching and/or a reprogramming of the filtering characteristics and/or an automatic compensation are/is carried out in the sensor head.

The inventive measuring system has the advantage that—due to the distributed controlling—malfunctions in the transducer system are immediately recognized and unwanted consequences, for example a false alarm or shutdown of the medium-voltage or high-voltage system respectively the monitored device, can be avoided. Furthermore, measurements can be carried out with high resolution (e.g. raised from currently 12 bit to 16 bit) as well as a range switching and a measured value correction can be carried out in the sensor head with respect to offset, gain, temperature or lifetime (aging). The automatic compensation can be performed both during manufacturing (enabling improved inspection technologies and fabrication techniques) and during operation. Moreover, the measuring system according to the invention enables a combined controlling of energy and data transmission and, due to the overall low power consumption and due to the dynamic operating mode, the lifetime of the optical transmitter (laser diode) is increased considerably compared to the above cited prior art.

Furthermore this purpose is achieved in accordance with a method for measuring currents or voltages in medium-voltage or high-voltage systems or in mining with optical signal or energy transmission between a central measuring unit and a sensor head having at least one sensor element, wherein microprocessors situated in the measuring unit and in the sensor head carry out transmitting, measuring and monitoring tasks in accordance with the principle of distributed controlling with bi-directional data communication, wherein the microprocessor located in the measuring unit controls the energy transmission in a dynamic operation based on a frame synchronization signal, wherein for preprocessing the measured values and/or automatic compensation in the sensor head, a measuring of the reference voltage in a climatic test chamber and storing in at least one microprocessor is carried out, and wherein the microprocessor located in the sensor head carries out a compensation operation and an error computation and controls a DC-free and error correcting data transmission.

The inventive method has the advantage that, in a surprisingly easy way, low energy consumption and safe optical data transmission are possible. Depending on the operating status, parameters or data are transmitted between both microprocessors acting as distributed controllers with bi-directional data communication and data/messages are monitored with respect to data transmission quality and arrival on time.

In a preferred embodiment of the invention, an analog-to-digital converter is provided in the sensor head, which is connected to the microprocessor and the microprocessor corrects the digital measured value received from the analog-to-digital converter and/or expands the data with system information, segments the resulting data, encodes them by means of block encoding and provides them with information for segmentation in such a manner that a DC-free and error correcting data transmission is possible.

This embodiment of the invention has the advantage that overload of the amplifiers provided for data transmission is reliably avoided (in consequence of the DC-free characteristic) and that by adding redundancy at the transmitter and error correction at the receiver a safe data transmission can be built up (in consequence of the possibility for error correction).

In a further development of the invention, the sensor head contains a multiplexer whose inputs are each connected to sensor elements, where the switching of the measuring channels is carried out by the microprocessor.

This further development of the invention is advantageous in that further measurement signals can be fed to the microprocessor which allows, for example, to carry out a compensation in the sensor head or phase comparison measurements (several sensor heads).

In a preferred embodiment of the invention, an impedance converter for the measurable value to be tapped is connected to the output of the multiplexer and a differential amplifier with configurable gains is located between the output of the impedance converter and the input of the analog-to-digital converter, which is connected to the microprocessor for range switching.

This embodiment of the invention is advantageous in that the impedance converter generates a high-impedance input wherein the differential amplifier facilitates the adaptation to the dynamic range of the analog-to-digital converter. Furthermore, the range switching allows use of the measuring system according to the invention for several measuring ranges (whereas so far in the state of art a separate measuring system has been required for every measuring range).

In accordance with an aspect of the invention, the sensor element preferably contains an ohmic voltage divider for measuring DC or AC voltages and/or for current measurement contains an inductive current converter with a successive filter for filtering of transients and high-voltage impulses and a serially connected protective device.

The combination of filter and protective device reliably avoids both the distortion of the measurement by transient and high-voltage impulses and the damaging/destruction of the measuring system.

In another embodiment of the invention, a temperature sensor is located in the sensor head, which is connected to one of the inputs of the multiplexer. Furthermore, the sensor head may contain a reference voltage source and controlled by the microprocessor the respective temperature dependent reference voltage value—used for compensation—can be fed in over an input of the multiplexer or a control input of the analog-to-digital converter.

This embodiment of the invention is advantageous in that in surprisingly simple way, compensation with respect to temperature and aging, i.e. the subtraction of the temperature response of the reference voltage and the temperature response and the aging of the components, e.g. the amplifier, is made possible.

In a preferred embodiment of the invention, a filter connected with the optical receiver is provided in the sensor head, wherein the frame synchronization signal and/or the successive data signal can be measured at the output of the filter and can be fed to the microprocessor.

The filter enables the filtering of the signals of interest (frame synchronization/data) respectively the removal of interference signals of higher frequencies, wherein the frame synchronization facilitates the synchronization of transmitter and receiver in a simple way.

In another preferred embodiment of the invention, a voltage converter connected to the optical receiver is located in the sensor head, which serves for voltage supply in the sensor head, and the microprocessor monitors the voltage measurable at the energy accumulator of the voltage converter.

In a measuring system according to the invention, the energy supply is done by optical means, whereby a separation of the potentials is given in a simple way. Monitoring the voltage allows a reduction of the transmitted energy to the requirement amount, which results in a longer lifetime of the optical transmitter/the laser diode. The generation of light pulses preferably is done with the method of pulse width modulation (instead of an amplitude modulation), so that the energy consumption can be optimized. Furthermore, a defined start-up/shut-down behavior (particularly communication) only occurs if the required voltage has been reached.

Preferably, an amplifier is previously connected in series to every optical transmitter, and furthermore another amplifier is subsequently connected in series to the optical receiver in the central measuring unit.

The use of amplifiers allows at the same time an energy-saving way of work and a correct operation of the optical transmitter/laser diodes by only generating the current required by those.

Finally, the central measuring unit may contain at least one interface circuit and a digital signal processor connected to the microprocessor is located in the central measuring unit, which can be both configured and read out from outside over the interface circuit.

Thus, the digital signal processor can be read out as well as configured/programmed in a simple way, which allows e.g. to configure other computations.

BRIEF DESCRIPTION OF THE DRAWING

Further advantages and details can be extracted from the following description of a preferred embodiment of the invention with reference to the drawing.

DESCRIPTION OF THE PREFERRED EMBODIMENT

Figure 1:
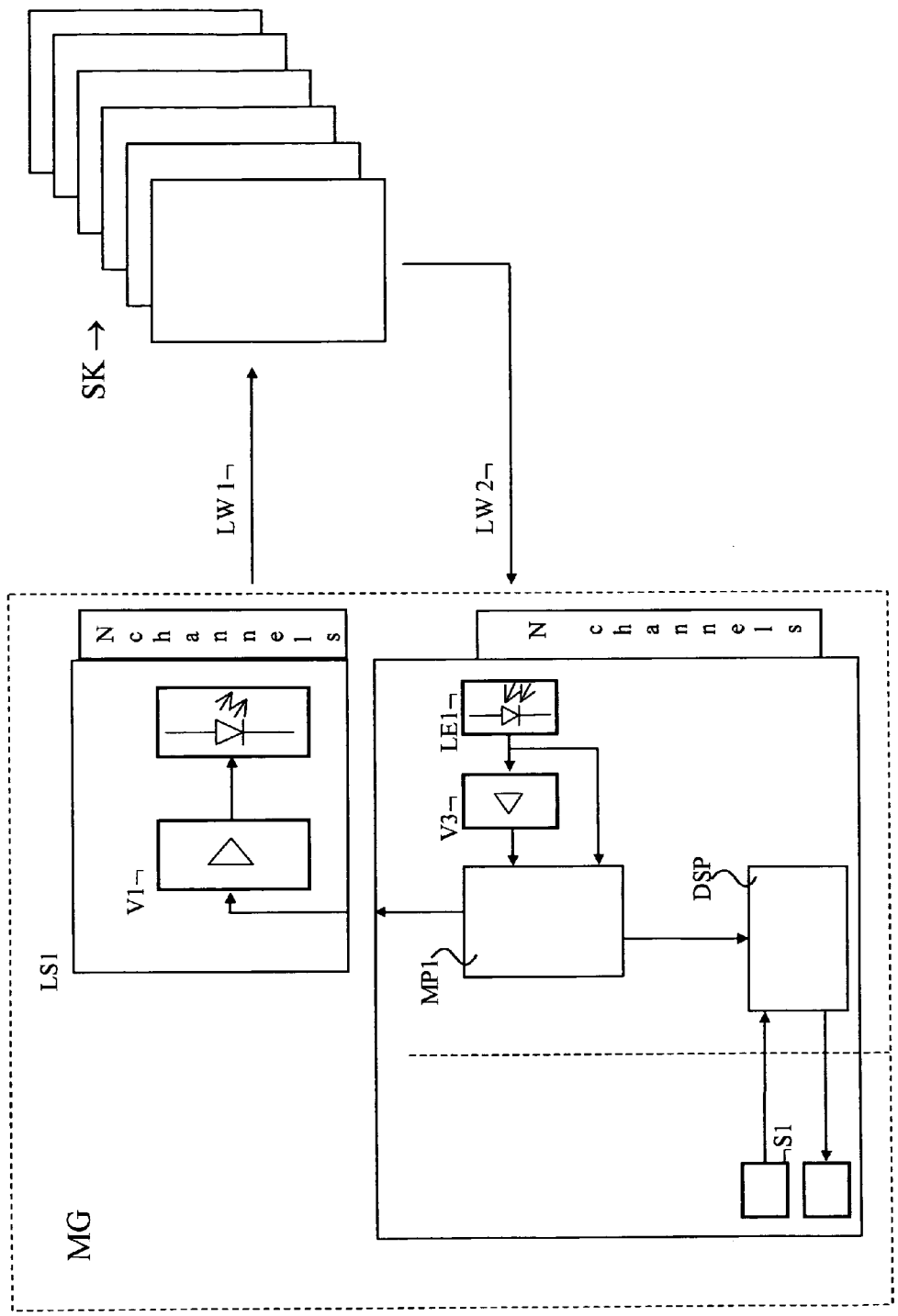
FIG. 1 shows the block diagram of the overall measuring system.

The block diagram of the overall measuring system shown in FIG. 1 preferably serves for voltage or current measurements in medium-voltage or high-voltage systems; furthermore it can also be applied in mining.

For optical signal and energy transmission between a sensor head SK with at least one sensor element S1 and a central measuring unit MG an optical transmitter LS1 (e.g. a transmitting laser with a wavelength between 800 nm and 950 nm) controlled by a microprocessor MP1 is provided in the central measuring unit MG, which preferably emits a superposition of light components from an AC and a DC component to a first optical wave guide (LW1) for purposes of data communication and energy supply of the sensor head.

Figure 2:
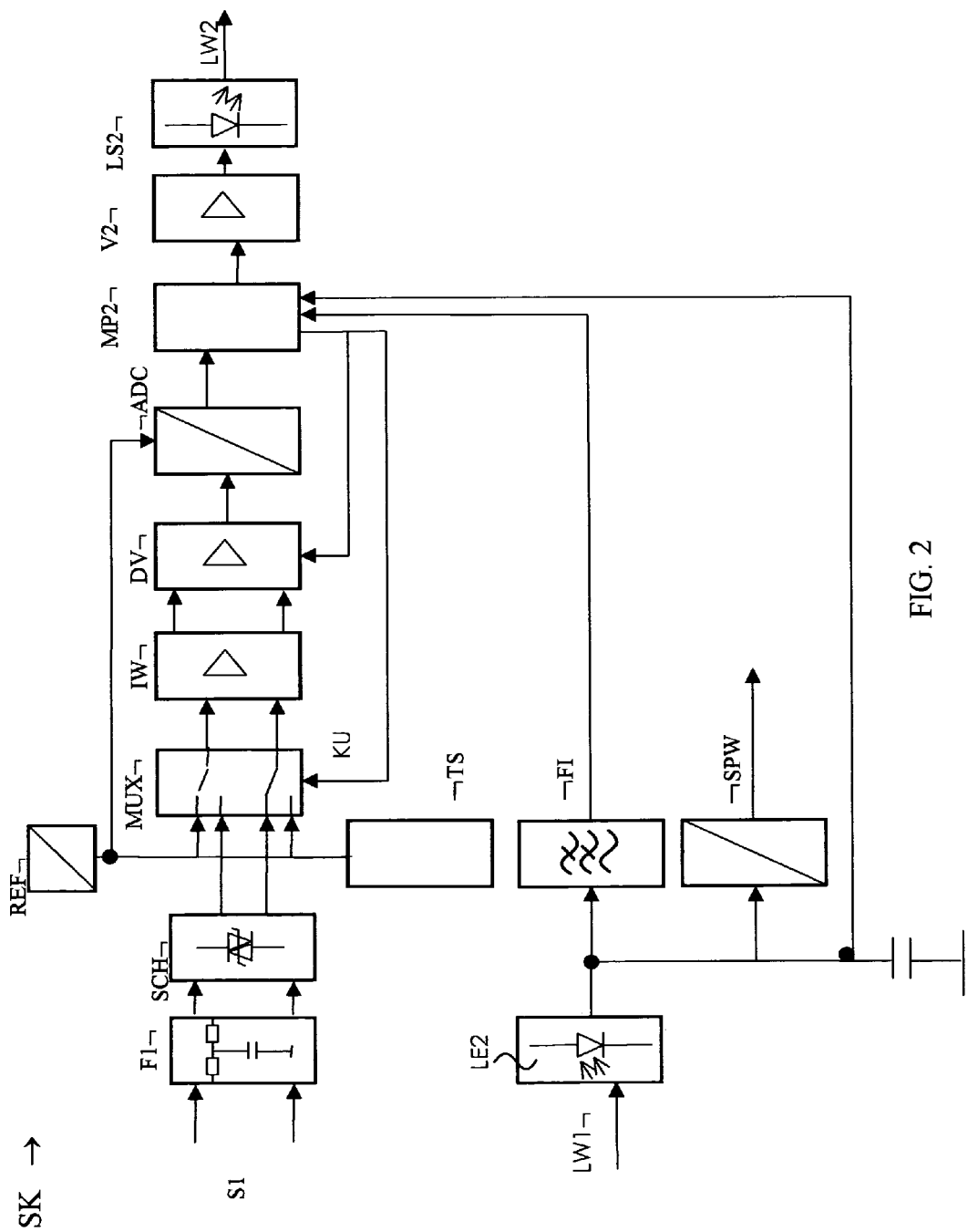
FIG. 2 shows the block diagram description of an embodiment of the sensor head according to the invention.

The block diagram of a first embodiment of the inventive sensor head is shown in FIG. 2, wherein an optical receiver LE2 connected to the first optical wave guide LW1 and a microprocessor MP2 are provided in the sensor head SK. According to the invention the microprocessor MP2, being activated by the optical receiver LE2, serves for controlling the sensor element S1, acquiring and processing of the values measured by the sensor element S1 and for transmission of preprocessed measurement values to the central measuring unit MG. For this purpose, the microprocessor MP2 controls an optical transmitter LS2 located in the sensor head SK, wherein data communication occurs over a second optical wave guide LW2 to an optical receiver LE1 located in the central measuring unit MG.

Both microprocessors MP1, MP2 carry out transmitting, measuring and monitoring tasks as to the principle of distributed controlling with bi-directional data communication. Furthermore, a preprocessing of the measured values is carried out in the inventive sensor head SK, whereas a measured value correction and/or a range switching and/or a reprogramming of the filtering characteristics and/or an automatic compensation; this is explained in the following.

Figure 3A:
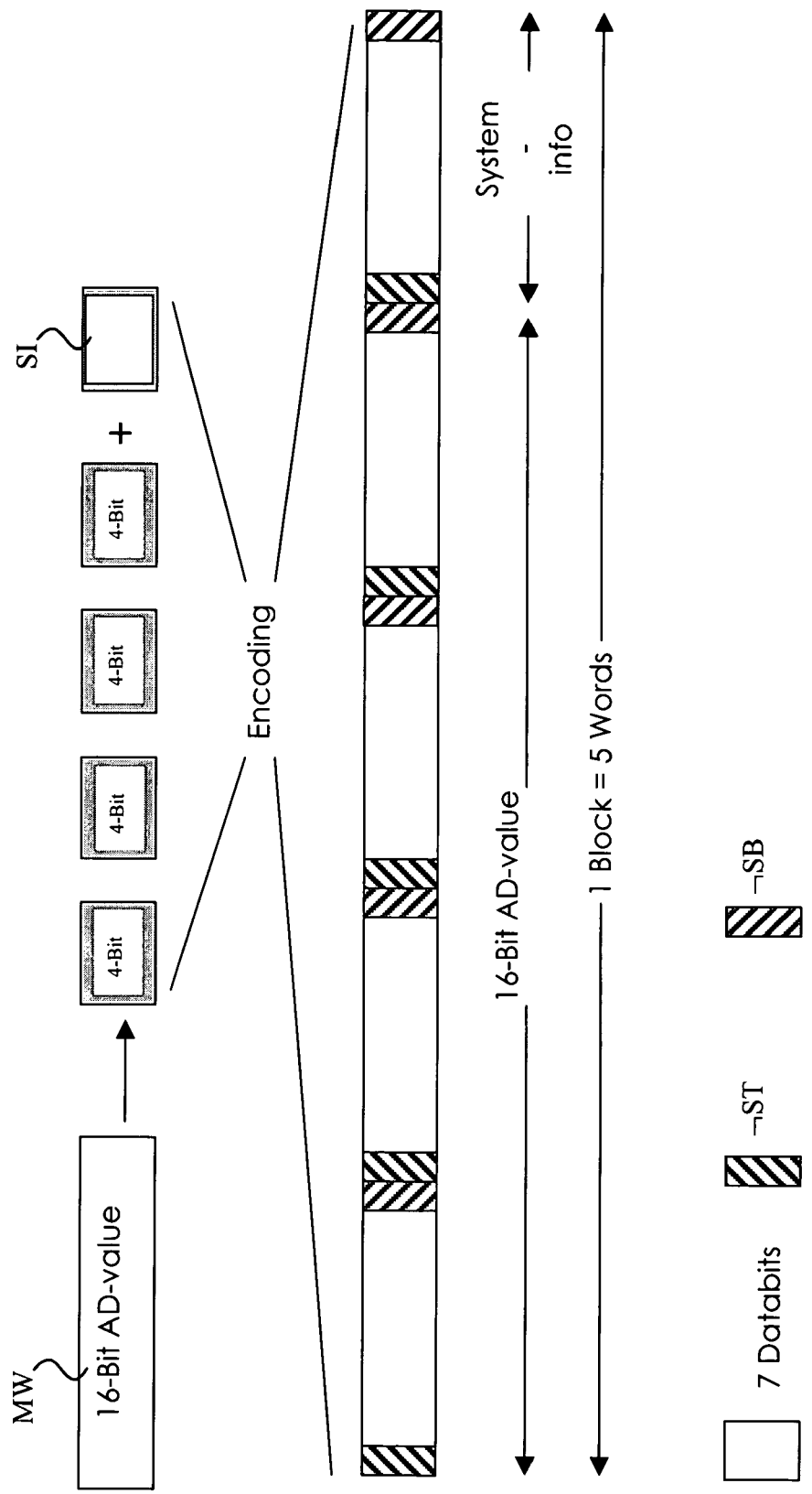
FIG. 3a shows the structure of a transmit telegram.
Figure 3B:
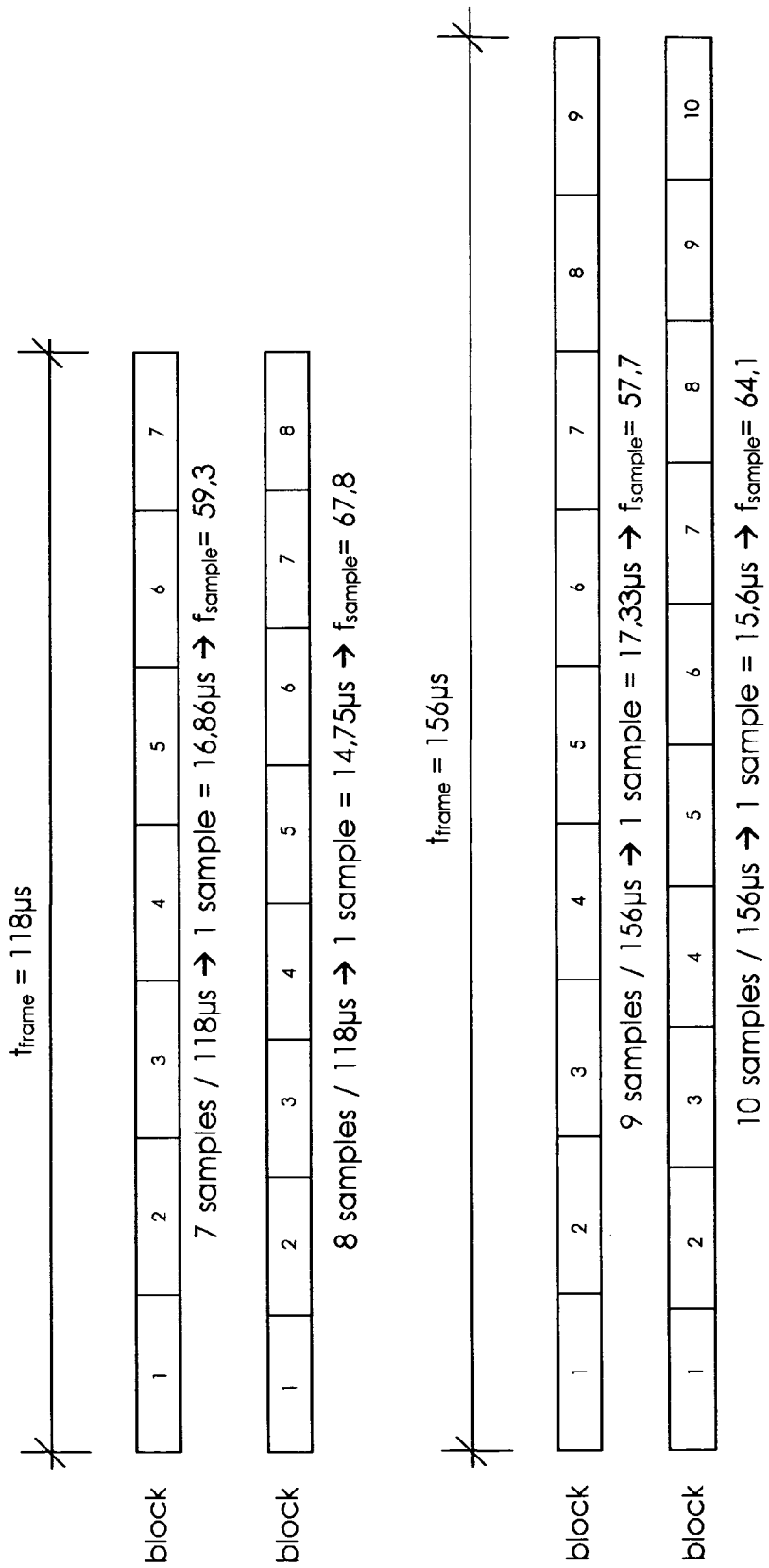
FIGS. 3b, 3c shows the data transmission at two different sampling rates.
Figure 3C:
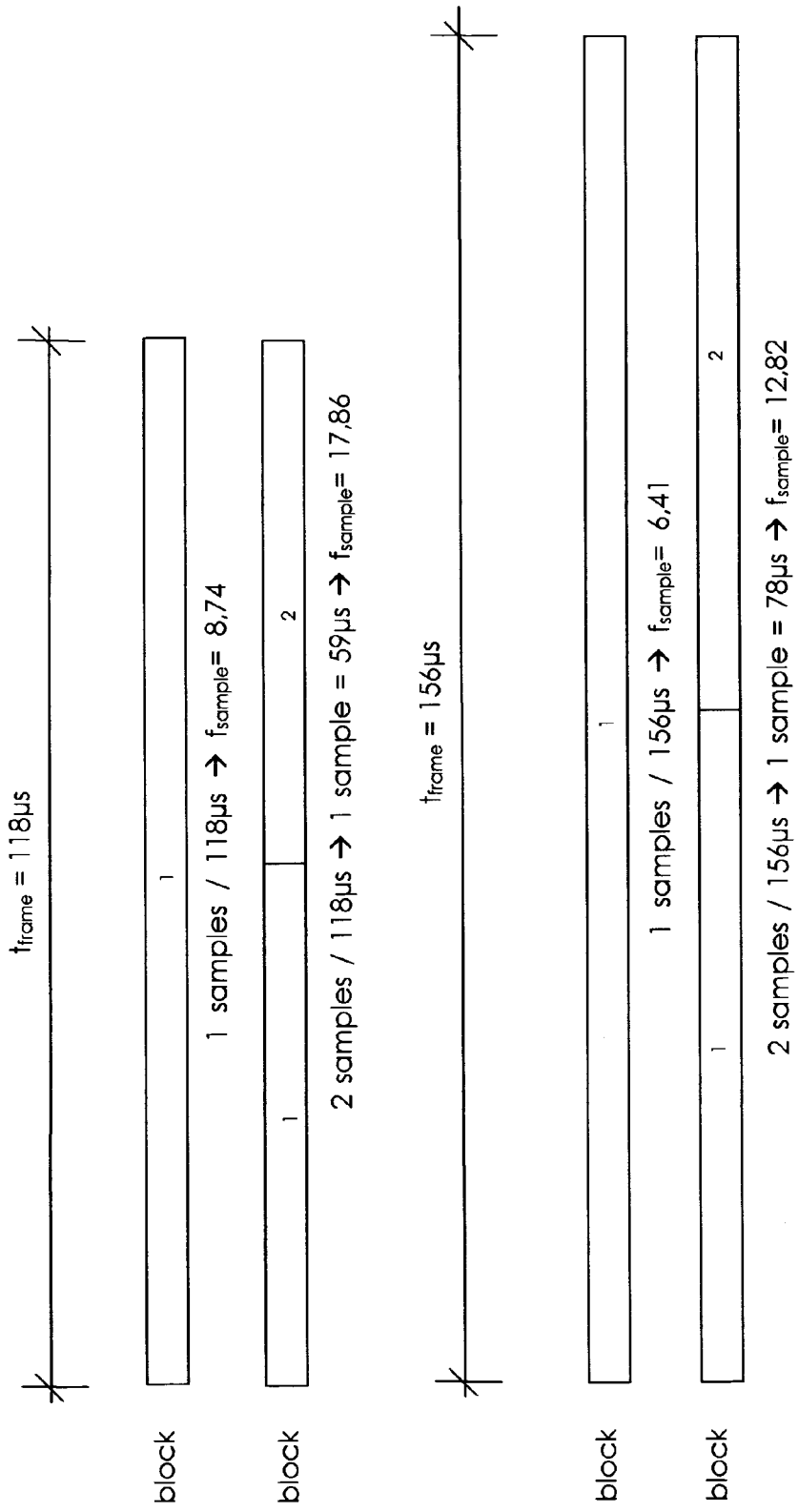
Figure 3D:
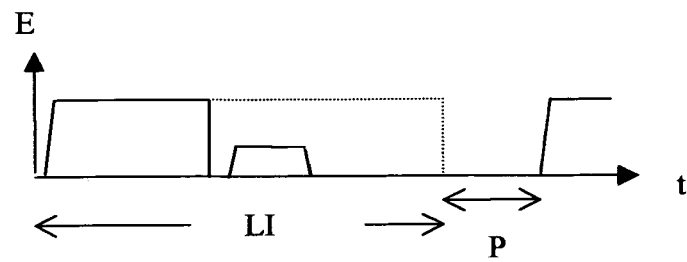
FIG. 3d shows the time behavior of energy transmission to the sensor head.
Figure 5:
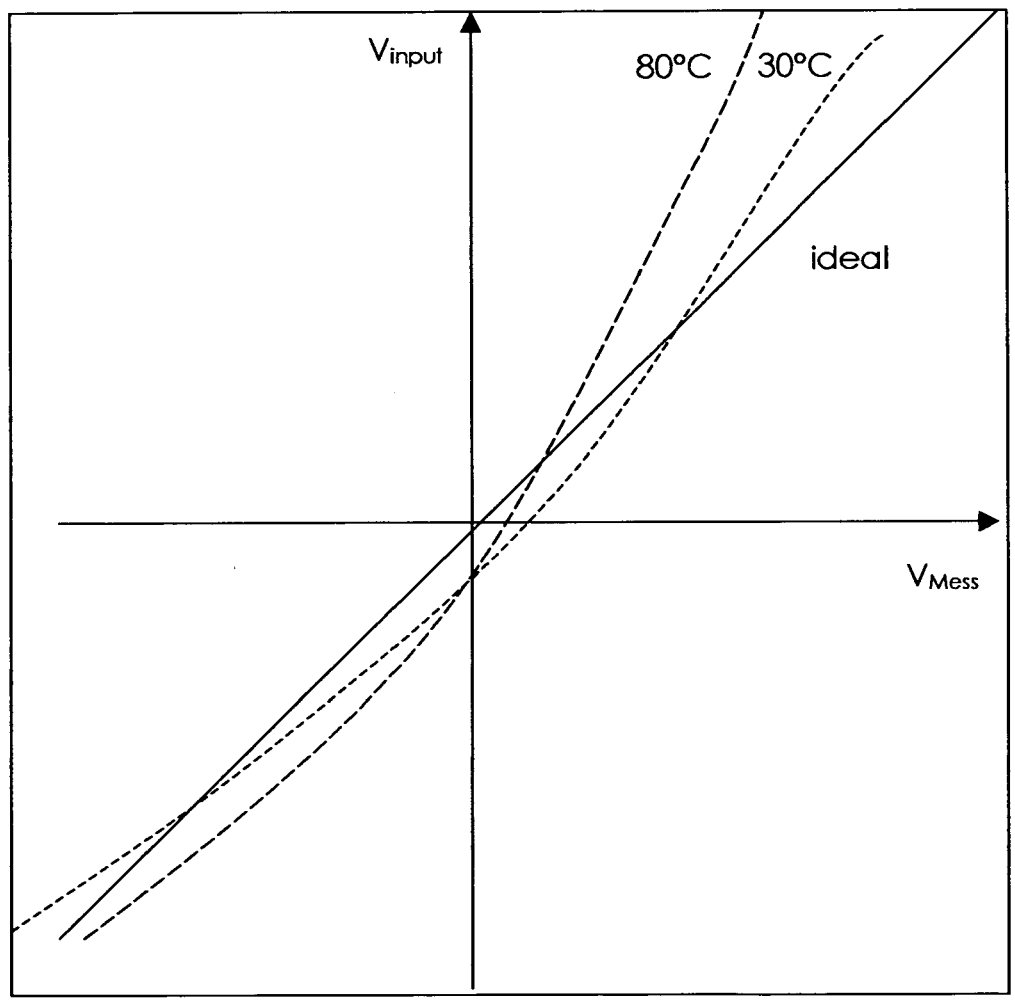
FIG. 5 shows an example for characteristic curves with compensational parabolas.

According to the invention a frame synchronization signal is transmitted between the central measuring unit MG and the sensor head SK, which serves both for supplying power as well as for deriving a clock signal for block-oriented data transmission (see FIG. 3d). The sensor head SK becomes its supply voltage from the optical transmitter LS1 over the first optical wave guide LW1 by means of time-discrete laser pulses, which together with the laser pulse width are a measure for the supply voltage. FIG. 3d shows the laser pulse LI and the pause P, where the largest width of the laser pulse LI is depicted by a dotted line. After the laser pulse LI the central measuring unit MG optionally transmits a data of one byte (plus start and stop bit ST, SB see FIG. 3a). Thereby the following parameters can be transmitted for example: measurement range to be configured, filter configuration, distance between the reference measurements. Data transmission is carried out with the method agreed upon in the parameter exchange, wherein data safety can preferably be obtained by use of parity bit and checksum. With the detection of every frame synchronization signal a timer starts in the microprocessor MP2. If the timer exceeds a pre-configurable time limit it has to be assumed that supply of the unit is faulty. The central measuring unit is notified of this by a telegram, the sensor head SK goes into an idle state and waits for the next signals of the optical transmitter LS1 (laser diode). Thus, the clock of the laser pulses LI controls the time of transmission of the measurement data from the sensor head SK to the central measuring unit MG. Every request to transmit data to the central measuring unit MG is marked by the start of a laser pulse LI. Thereby the microcontroller MP1 receives two pieces of information about its generation of the operating voltage for the two-position control. For this purpose two voltage comparators indicate if the voltage delivered by the laser pulse LI is too high (upper threshold) or too low (lower threshold) so that the laser pulse LI can be changed (decremented, i.e. reducing the energy supply step by step or infinitely variable or incremented, i.e. increasing the energy supply step by step or infinitely variable) step by step (dynamic operation). For this voltage information one bit within the transmit telegram is sufficient, which is reported by the sensor head SK to the central measuring unit MG (increase or reduce). Preferably it is also possible to carry out a simple threshold control with a pre-configurable threshold, e.g. with the lower threshold. In this dynamic operation the influences of the measured temperature, reference voltages and offset voltage (measurement against ground) are also taken into account as the sensor head SK is subject to higher changes in temperature (see the subsequent explanations).

In the sensor head SK an analog-to-digital converter ADC is provided which is connected to the microprocessor MP2. In normal operation mode the microprocessor MP2 performs a serial readout of the digitalized measured value MW (see FIG. 3a) from the analog-to-digital converter ADC, carries out an error correction and coding and serially transmits the corrected and coded data over the second optical wave guide LW2 to the central measuring unit MG. The sensor head SK contains a multiplexer MUX, which has each of its inputs connected to sensor elements S1 (FIG. 2, FIG. 7), wherein the switching between measurement channels KU is carried out by the microprocessor MP2. At the output of the multiplexer MUX an impedance converter IW is connected for the measurable value and between the output of the impedance converter IW and the input of the analog-to-digital converter ADC a differential amplifier DV with configurable gain is located, which serves for range switching BU and is controlled by the microprocessor MP2 respectively is switched when a gain is configured. Furthermore, the sensor head SK contains a reference voltage source REF. The microprocessor MP2 generates a correction value from the measurement of the reference voltage (e.g. three-point calibration). With this calibration the inventive measurement system eliminates the gain error and offset error (as long as the non-linearity is negligibly small), wherein the respective temperature-dependent reference voltage value is fed in over an input of the multiplexer MUX or a control input of the analog-to-digital converter ADC. Furthermore, a filter FI connected to the optical receiver LE2 is located in the sensor head SK, where the frame synchronization signal and/or the subsequent data signal can be measured at the output and fed into the microprocessor MP2. Thereby, the rising edge of the frame synchronization signal, which is at the start of every data transmission, i.e. the laser pulse, can be detected (comparator). Furthermore, a voltage converter SPW connected to the optical receiver LE2 is located in the sensor head SK, which serves for voltage supply in the sensor head SK (including the amplifier V2), where the microprocessor MP2 monitors the voltage measurable at the energy store of the voltage converter SPW.

Figure 7:
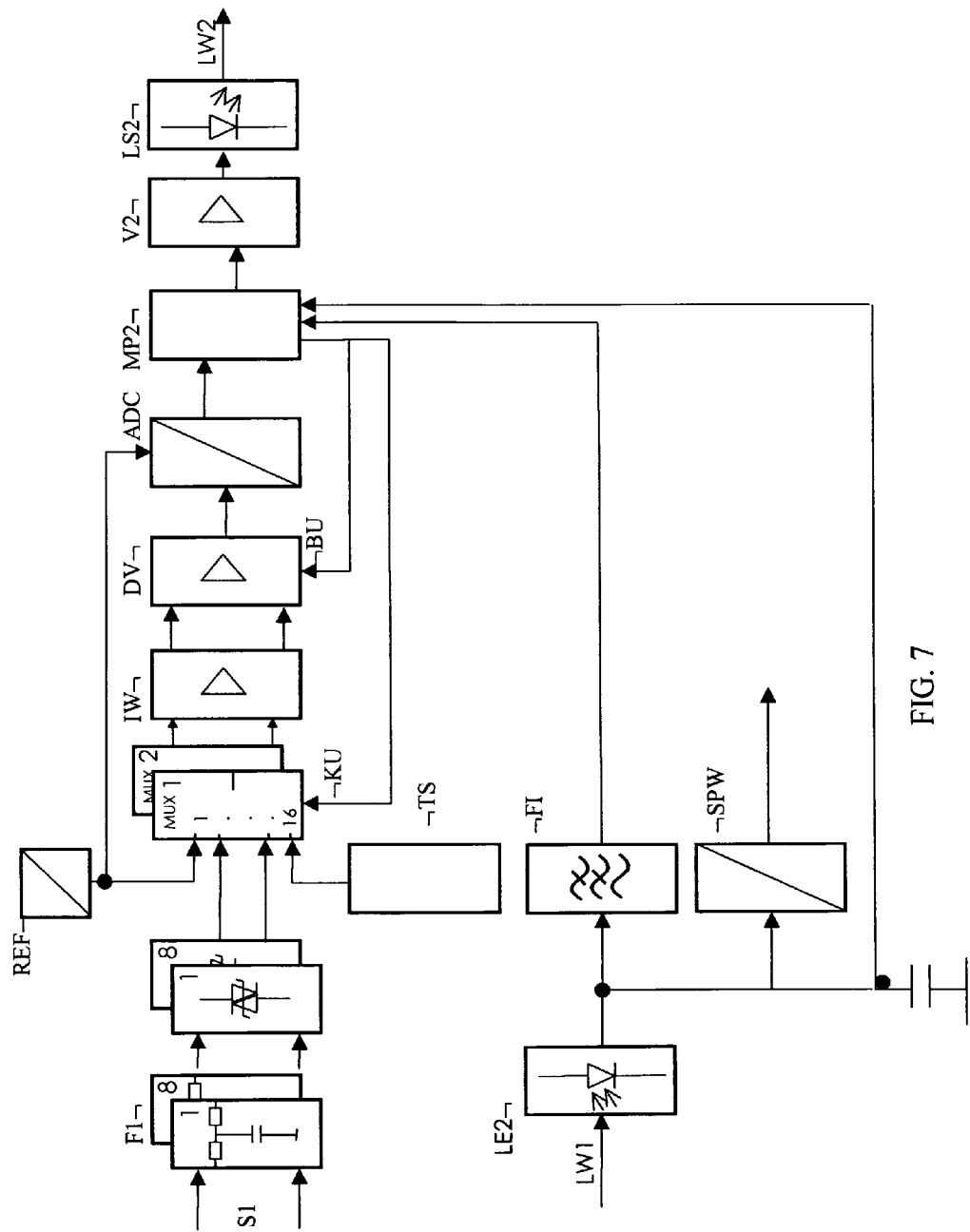
FIG. 7 shows the block diagram of a second embodiment of the sensor head according to the invention.

In the embodiments shown in FIG. 2 or 7, the sensor element S1 for measurement of DC or AC voltage contains an ohmic voltage divider and/or an inductive current converter with a subsequent filter F1 for filtering of transient and high-voltage impulses for current measurement as well as a protective element SCH (against excessive voltage) connected in series. In case of measurements with a test shunt the voltage is measured at four places of the test shunt in order to reduce the thermal voltage, whereby the test cables are connected to a clamp bar being twisted and shielded. The clamp bars as well as the four inner and outer shields are bridged. The potential of the shields serves as a reference potential in the sensor head SK and it is possible to connect several sensor heads SK (see FIG. 7) in parallel for measuring of a test shunt.

Furthermore a temperature sensor TS is located in the sensor head SK, which is connected to one of the outputs of the multiplexer MUX. Based on the temperature and, for example, on the temperature increase caused by the current flow through the shunt the microprocessor MP2 calculates a correction value. By means of this correction value and a shunt correction value (see system information SI) the error caused by the temperature increase is compensated.

For obtaining a DC-free and safe transmission the data are, according to the invention, encoded before being transmitted. FIG. 3a shows the structure for an embodiment of a transmit telegram. The 16-bit data word MW fed in by the analog-to-digital converter ADC is segmented by the microprocessor MP2, e.g. into 4-bit segments, and these words are encoded into 7-bit words (with information for segmentation) by means of an encoding table, which is stored in the microprocessor MP2 or in a memory (not depicted). Preferably, a word containing system information SI (voltage control, temperature, etc.) is transmitted in addition to these four words.

In this embodiment the data volume to be expected is calculated from the number of blocks transmitted per frame. For the example shown in FIG. 3a, 45 bits have to be transmitted after encoding (including start and stop bits ST, SB) for a sample value of 16 bit, which equals one block. Depending on the desired sampling frequency a variable number of blocks have to be transmitted in a frame. As the number of blocks has to be an integer, the sampling frequency cannot be chosen arbitrarily. Subsequently, several examples for transmission rates at different sampling rates are listed:

$t_{frame}$: 118 µs $\lfloor f_{sample}$=17.86 kHz; transmission rate=45 Bit*17.86 kHz=803.7 kBit/s $t_{frame}$: 156 µs $\lfloor f_{sample}$=12.82 kHz; transmission rate=45 Bit*12.82 kHz=576.9 kBit/s $t_{frame}$: 118 µs $\lfloor f_{sample}$=59.3 kHz; transmission rate=45 Bit*59.3 kHz=2.67 MBit/s $t_{frame}$: 156 µs $\lfloor f_{sample}$=57.7 kHz; transmission rate=45 Bit*57.7 kHz=2.6 MBit/s The frame structure for two different sampling frequencies, preferably sampling frequency 60 kHz and 10 kHz are shown in FIG. 3b and FIG. 3c respectively.

Figure 8:
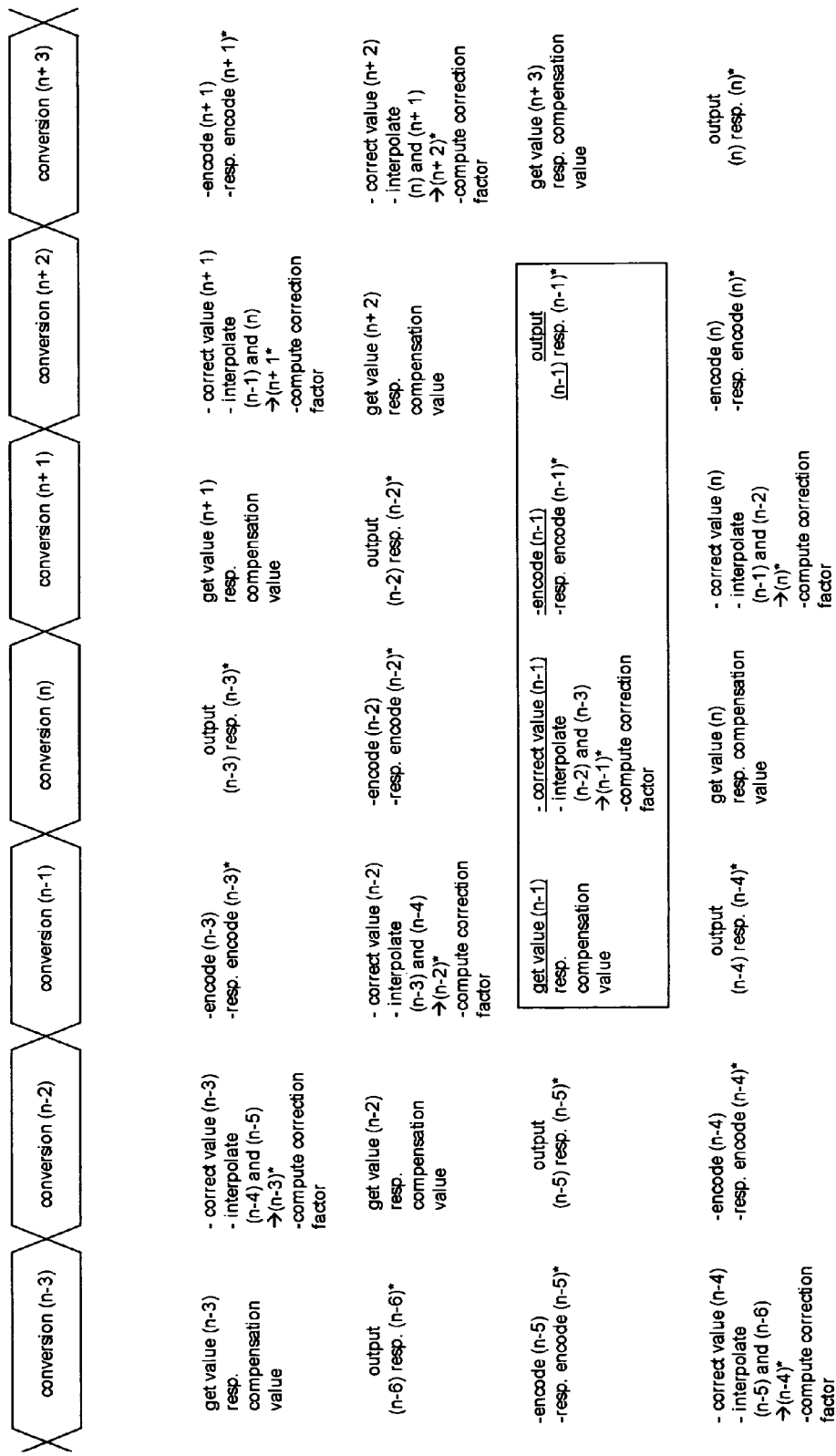
FIG. 8 shows the processing sequence for interpolation of the measured values (n−2) and (n−1) into (n)
Figure 9:
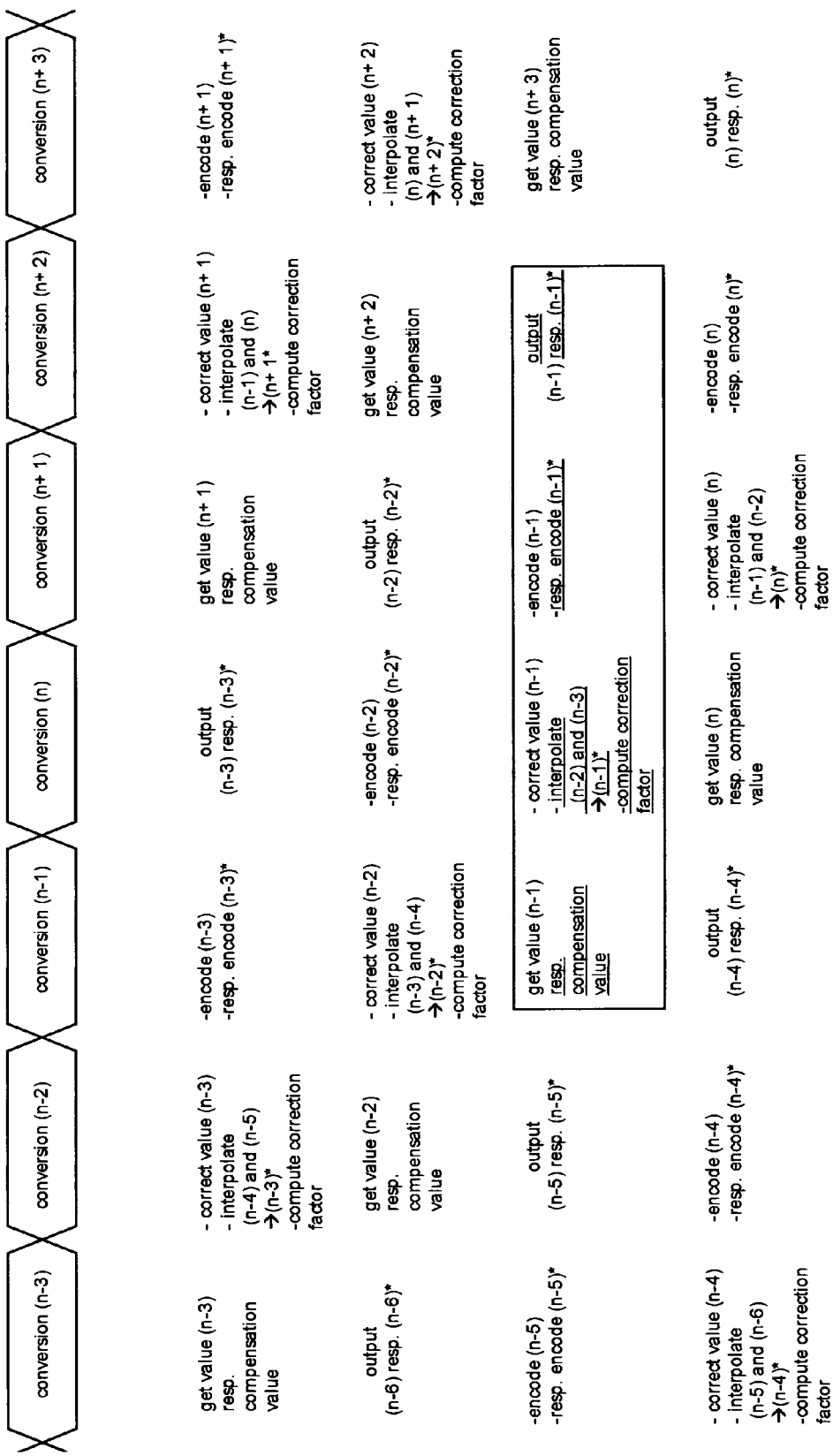
FIG. 9 shows the processing sequence for determination of the correction factor.

According to the invention, for increasing the measurement accuracy an error correction is carried out for the digitalized measured values MW (e.g. voltage values). The correction factors required therefor are determined by the microprocessor MP2 located in the sensor head SK by means of a periodic compensation procedure and are used for correction up to the next compensation. As during read-in of a compensation value a read-in and processing of a current measured voltage value MW cannot be carried out, an interpolated value is encoded and transmitted, according to the invention, instead of the regular value. The processing sequence for interpolating the measured values (n−2) and (n−1) to value (n) is shown in FIG. 8 and the processing sequence for determining the correction factor is shown in FIG. 9; there the difference to normal operation is emphasized by the word "or". The interpolation of the measured values (n−2) and (n) to value (n−1) was done in an analogous way (not shown). By storing the measured values (n−2) and (n), where the compensation procedure (n−1) is lying in between, an interpolation of the measured value (n−1) can be performed. The distance between capturing the compensation values is preferably in the range of minutes.

Figure 4:
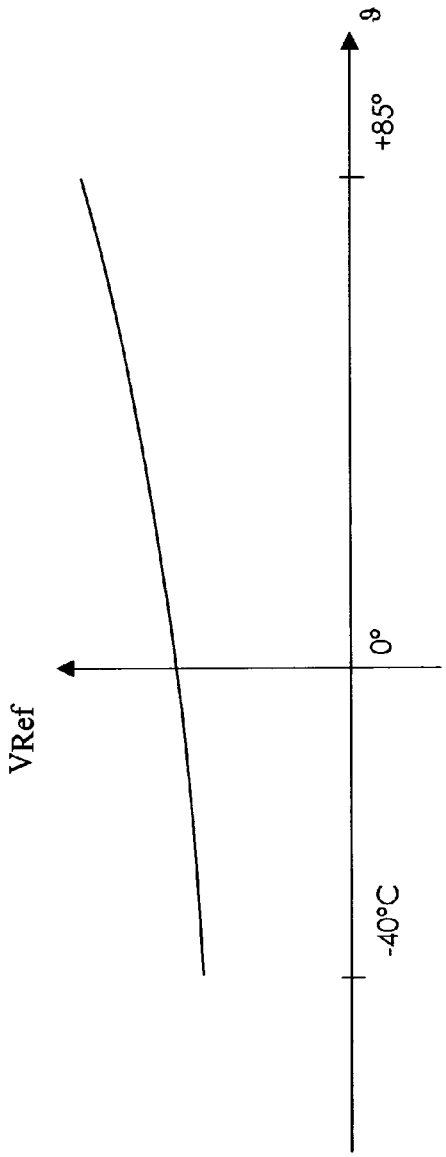
FIG. 4 shows an example for temperature response of the reference voltage $V_{Ref}$.

Furthermore, in an inventive measuring method, the reference voltage is measured in a climatic test chamber from outside with a precise measuring instrument. The measured values, which are for example measured at temperatures of −40° C., 0° C. und +85° C. are stored in the microprocessor MP2; an example for this is shown in FIG. 4. The measured values describe a parabola, which is used for error correction. Using the parabolic equation it is possible to determine a value of the reference voltage for every temperature. According to the invention a table of intermediate values is computed by means of the parabolic equation as described in the following:

Δθ=+85° C.−(−40° C.)=125° C.

$\lfloor$1 voltage value/° C.=125 voltage values (16-Bit width)
$\lfloor$required memory: 16 Bit*125=2000 Bit=250 Byte For example, two voltages (+$V_{Ref}$, −$V_{Ref}$) and GND are successively digitalized in the compensation procedure by the analog-to-digital converter ADC. Additionally, the current temperature of the unit/sensor head SK is determined by the temperature sensor TS. With these parameters an error correction can be performed as follows.

The reference voltage value can be determined from the table depending on the current temperature. Then the compensation parabola is computed with the real value of the reference voltage (temperature-dependent), the measured values of the reference voltage (pos., neg.) and the offset at GND.

I $y_1=ax_1^2+bx_1+c$ with $y_1$=real value $V_{Ref}$(pos.); $x_1$=measured value $V_{Ref}$ II $y_2=ax_2^2+bx_2+c$ with $y_2$=real value $V_{Ref}$(neg.); $x_2$=measured value $V_{Ref}$ III $y_3=ax_3^2+bx_3+c$ with $y_3$=real value GND (=0V); $x_3$=measured value GND Accordingly, a system of equations with three variables has to be solved, the compensation parabola has to be determined, the correction factors (a, b, c) have to be stored and used up to the next compensation.

Error correcting computation: $v_{input}=av_{Mess}^2+bv_{Mess}+c$

This means that for correcting one measured value, two multiplications and two additions have to be computed.

In case of using a straight-line curve instead of a parabola for compensation the correction procedure is reduced to one multiplication and one addition. Additionally, the correction factors can be determined with less computational effort, wherein the temperature correction computation of the measured value, e.g. received from the test shunt, is carried out by means of a polygonal sequence stored in the microprocessor MP2 and the temperature in the shunt (over the measured temperature in the shunt) (aging of the test shunt is not taken into account by the error correction procedure). The interval between the reference measurements is reported from the microprocessor MP1 to the microprocessor MP2 of the sensor head during parameterization, and during the reference measurement a measuring of the current value is not carried out and the preceding measured value is transmitted. In order to guarantee a small jitter (several hundred ns) between the single measurements, the measurement of the value is carried out directly with the frame synchronization signal.

Figure 6A:
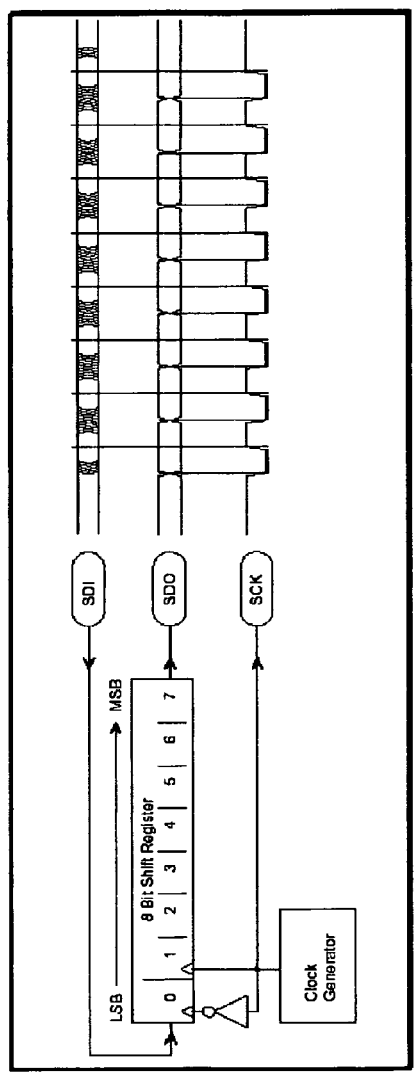
FIGS. 6a and 6b shows the time schedule for controlling by the microprocessor in the sensor head.

FIG. 6a shows an interface circuit (Serial Peripheral Interface) which is located between analog-to-digital converter ADC and microprocessor MP2. The SPI interface is based on an 8-bit shift register. The clock SCK is provided by the microprocessor MP2. A clock generation by the microprocessor MP2 only occurs if data are transmitted. Between transmissions SCK is in an idle mode. Transmitting and receiving occurs simultaneously. While microprocessor MP2 transmits its data, data from the analog-to-digital converter are received. This means that a transmission of data always has to be carried out even if currently nothing is received. The data exchange depicted in FIG. 6a, shows the following: data to SDO are transmitted with the falling edge, data to SDI are received with the rising edge. The idle level of SCK is high.

Figure 6B:
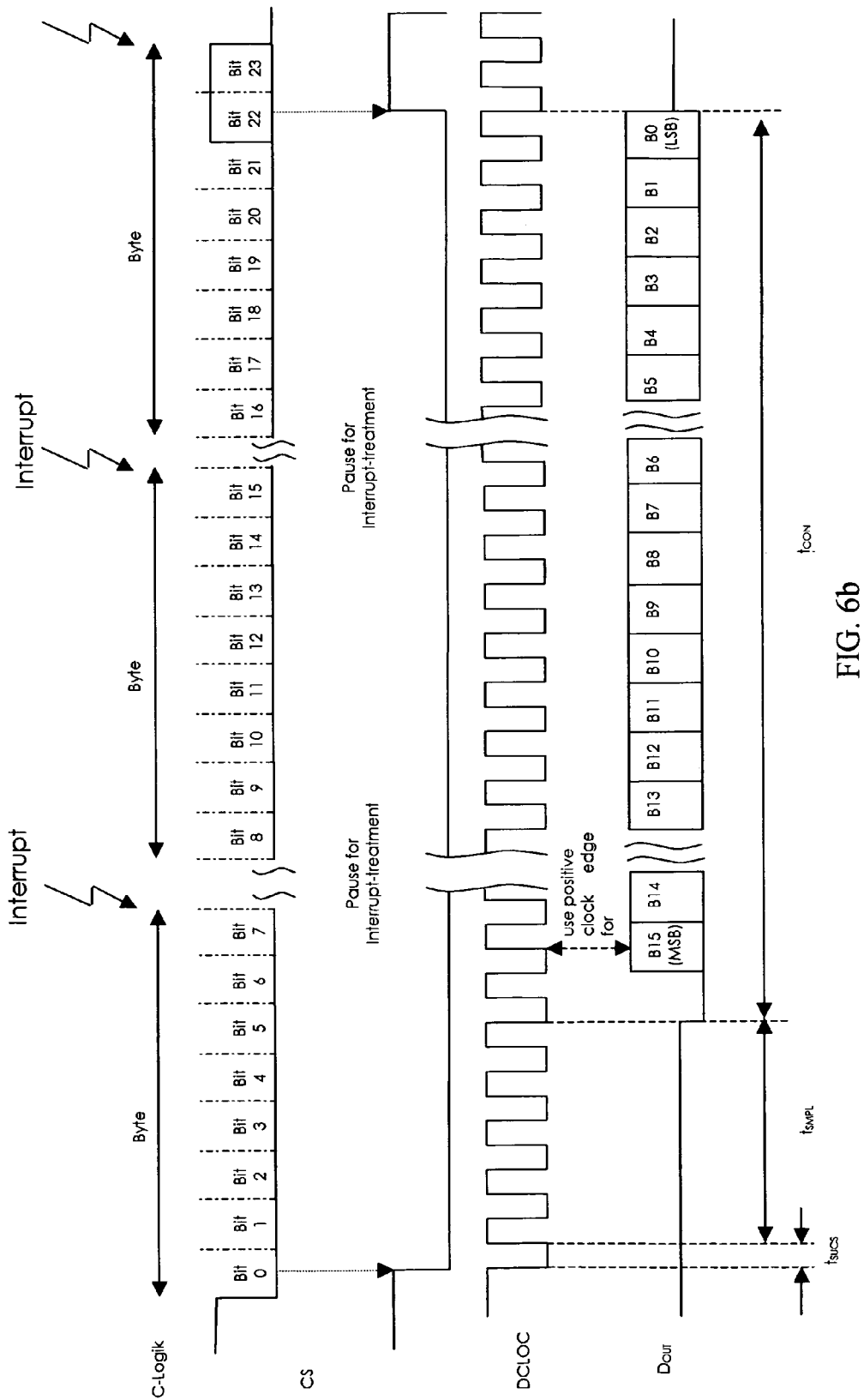

The cooperation between analog-to-digital converter ADC and microprocessor MP2 is described subsequently. Data have to be transmitted constantly from microprocessor MP2, so that a clock is generated for the analog-to-digital converter ADC. These data are dummy data without information content and transmitting and receiving is performed simultaneously. All in all, 24 bit=3 byte have to be transmitted for one conversion cycle. After transmission of the first byte has been carried out, which is signaled by an interrupt, the receive buffer has to be read in the interrupt service routine and a new byte has to be written into the transmit buffer. During this time the interface circuit SPI does not provide a clock to the analog-to-digital converter ADC and hence the ADC does not work. No data are lost. After handling of the interrupt service routine another byte is transmitted to the analog-to-digital converter ADC and simultaneously another one is received. The time schedule for control by microprocessor MP2 is shown in FIGS. 6a and 6b.

The complete conversion cycle requires 24 clocks, where the time for handling of the interrupt service routine has to be added two times. Task within the interrupt service routine are:
  reading of the receive buffer
  writing of the transmit buffer The interrupt is erased when a writing into the transmit buffer or a reading from the receive buffer is carried out.

Control of the analog-to-digital converter ADC may possibly be effected by connecting the MOSI pin (Master out, Slave in) to the analog-to-digital-converter ADC. By transmitting respective data the analog-to-digital-converter ADC can be activated or deactivated. The multiplexer MUX offers the possibility to connect reference voltages to the analog-to-digital-converter ADC. These voltages are used by the microprocessor MP2 for correction of the gain error which originates from the analog path. The correction computation can be switched off in order to receive the original measured values from the analog-to-digital converter ADC.

The power dissipation of the measurement system according to the invention has been determined in extensive test series as follows:

have to meet great demands and a maximum of efficient and safe transmission of measurement data has to be guaranteed, e.g. in mining, in medium-voltage or high-voltage systems or in industrial electronics, particularly in automatic control engineering. According to the invention a dynamic operation is performed based on the frame synchronization signal and the pulse width modulation together with a two-point control or a simple threshold control (fine tuning), the measurement values MW, which naturally contain an error component, are corrected in the sensor head SK by using the ambient temperature measured in the sensor head SK, the measured reference voltages and the measured offset voltage, and depending on the operation status parameters or data are transmitted between both microprocessors MP1, MP2 working as a distributed controller with bi-directional data communication and data/messages are monitored for data transmission quality and arrival on time.

In a further embodiment of the invention the measurement system can for example be used within the scope of real-time networking of controls (also real-time control over Ethernet or Powerlink), where the ability of the subscribers (e.g. drives, fast I/Os, sensors, actuators, display systems) for synchronization among each other and processing of data in the regulator clock of the drives is a requirement; the temperature sensor TS is connected over the interface circuit SPI to the microprocessor MP2 and is cyclically polled by the latter; instead of the microprocessors it is also possible to use a programmable logic for preprocessing of the measured values; sensor signals from external sensors S1 conveyed to the microprocessor MP1 over the digital signal processor can be fed in, etc.

I claim:

1. An apparatus for measuring currents or voltages in medium-voltage devices, high-voltage devices, or in mining devices using an optical signal or energy transmission, the apparatus comprising:
  a central measuring unit;
  a first microprocessor disposed in the central measuring unit;
  a first optical transmitter controlled by the first microprocessor to emit a superposition of different light components;

| $f_{sample}$ | 12.82 kHz | 17.86 kHz | 57.7 kHz | 59.3 kHz |
|---|---|---|---|---|
| power dissipation C-logic (V = 3.3 V) | $I_{AM}$ = 1.06 mA<br>$P_V$ = 3.5 mW | $I_{AM}$ = 1.47 mA<br>$P_V$ = 4.85 mW | $I_{AM}$ = 4.77 mA<br>$P_V$ = 15.75 mW | $I_{AM}$ = 4.9 mA<br>$P_V$ = 16.17 mW<br>(at 8 MHz) |
| Power dissipation AD-converter (V = 3.3 V) | $I_{AM}$ = 0.303 mA<br>$P_V \approx$ 1 mW | $I_{AM} \approx$ 0.455 mA<br>$P_V \approx$ 1.5 mW | $I_{AM} \approx$ 0.9 mA<br>$P_V \approx$ 3 mW | $I_{AM} \approx$ 0.9 mA<br>$P_V \approx$ 3 mW |
| Transmit diode (1A229-SMA) $t_{on}$ = 50% | $I_F \geqq$ 5 mA<br>$V_F$ = 1.6 V<br>$P_V \geqq$ 8 mW<br>$P_V \approx$ 4 mW | $I_F \geqq$ 5 mA<br>$V_F$ = 1.6 V<br>$P_V \geqq$ 8 mW<br>$P_V \approx$ 4 mW | $I_F \geqq$ 5 mA<br>$V_F$ = 1.6 V<br>$P_V \geqq$ 8 mW<br>$P_V \approx$ 4 mW | $I_F \geqq$ 5 mA<br>$V_F$ = 1.6 V<br>$P_V \geqq$ 8 mW<br>$P_V \approx$ 4 mW |
| Measured value amplifier | ca. 0.5 mA | ca. 0.5 mA | ca. 0.5 mA | ca. 0.5 mA |
| Voltage controller | 4.2 mW | 4.6 mW | 6.1 mW | 7.3 mW |
| SUM: | 18 mW | 21 mW | 35 mW | 36 mW |

The power dissipation of the voltage reference REF and the multiplexer MUX can be neglected.

A second embodiment with several sensor heads is shown in FIG. 7, wherein identical references are used.

The inventive measurement system can be used in any application where optical signal and energy transmission a first optical wave guide for transmitting data and energy from the first optical transmitter;
  a sensor head;
  a first optical receiver disposed in the sensor head to receive signals from the first optical wave guide;
  a sensor element disposed in the sensor head;

a second microprocessor disposed in the sensor head for activation by the first optical receiver to control the sensor element, to acquire and process values measured by the sensor element, and to control data communication;

an analog-to-digital converter disposed in the sensor head and connected to the second microprocessor;

a second optical transmitter for transmission of pre-processed measurement values from the second microprocessor;

a second optical wave guide to pass communication from the second optical transmitter; and a second optical receiver disposed in the central measuring unit to receive communication from the second optical wave guide, wherein the first and the second microprocessors are configured to perform transmitting, measuring and monitoring tasks to create a distributed controller with bi-directional data communication, wherein a frame synchronization signal serves for deriving a clock signal for block-oriented data transmission, the sensor head further comprising a filter connected to the first optical receiver, wherein a frame synchronization signal and/or successive data signals are measured at an output of the filter and are fed into the second microprocessor, wherein the second microprocessor is configured to correct digital measured data received from the analog-to-digital converter, expand the data with system information, segment the resulting data, encode the data by means of block encoding and provide the data with information for segmentation to facilitate DC-free, error correcting data transmission, wherein the apparatus is further configured to:

execute transmitting, measuring and monitoring tasks in distributed controlling with bi-directional data communication using said first and said second microprocessors;

control energy transmission in dynamic operation based on a frame synchronization signal using said first microprocessor located in said central measuring unit;

measure a reference voltage in a climatic test chamber and store said value in at least one of said first and said second microprocessors for preprocessing measured values and/or automatic compensation in said sensor head; and carry out a compensation operation and an error computation and controlling a DC-free and error correcting data transmission using said second microprocessor located in said sensor head.

2. The method of claim 1, wherein the apparatus is further configured to fine tune energy transmission by means of a pulse width modulation together with a two-position control or a simple threshold control, and to correct, before data transmission, measured values in said sensor head which contain an error component with the assistance of ambient temperature, reference voltages and offset voltage measured in said sensor head.

\* \* \* \* \*